US006656793B2

(12) United States Patent
Jeong et al.

(10) Patent No.: US 6,656,793 B2
(45) Date of Patent: Dec. 2, 2003

(54) METHOD OF FORMING A SELF-ALIGNED FLOATING GATE IN FLASH MEMORY CELL

(75) Inventors: Cheol Mo Jeong, Kyungki-Do (KR); Pyeng Geun Sohn, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/306,083

(22) Filed: Nov. 27, 2002

(65) Prior Publication Data

US 2003/0119259 A1 Jun. 26, 2003

(30) Foreign Application Priority Data

Dec. 22, 2001 (KR) .................................. 10-2001-83490

(51) Int. Cl.[7] ............................................. H01L 21/336
(52) U.S. Cl. ..................... 438/257; 438/296; 438/259; 257/314
(58) Field of Search .................................. 438/257, 259, 438/296, 284; 257/314, 315, 332

(56) References Cited

U.S. PATENT DOCUMENTS

| 4,385,975 | A | * | 5/1983 | Chu et al. ................ 204/192 E |
| 6,107,143 | A | * | 8/2000 | Park et al. ................... 438/296 |
| 2003/0100157 | A1 | * | 5/2003 | Hsu ............................ 438/257 |

* cited by examiner

Primary Examiner—Richard Elms
Assistant Examiner—Brad Smith
(74) Attorney, Agent, or Firm—Marshall, Gerstein & Borun LLP

(57) ABSTRACT

A method of forming a self-aligned floating gate in a flash memory cell. A capping layer is formed on a trench insulating film. An etching process is then performed to etch the trench insulating film to a desired dimension. Therefore, generation of a moat in the trench insulating film is avoided. Further, spacing of a floating gate formed in a subsequent process can be minimized.

18 Claims, 5 Drawing Sheets

METHOD OF FORMING A SELF-ALIGNED FLOATING GATE IN FLASH MEMORY CELL

BACKGROUND

1. Technical Field

A method of forming a self-aligned floating gate in a flash memory cell is disclosed. More specifically, a method of forming a trench insulating film is disclosed which is capable of preventing formation of a moat that is generated when the self-aligned floating gate is formed in the flash memory cell.

2. Description of the Related Art

Generally, a flash memory cell is fabricated using shallow trench isolation (STI) as a device isolation process. During the process of isolating a floating gate using a mask patterning, wafer uniformity is poor because of variations in the critical dimension (CD). It is thus difficult to implement a uniform floating gate. Further, there are problems such as program and erase fail of the memory cell, or the like, as a result of variations in the coupling ratio. In addition, when a space of below 0.13 μm is implemented in a highly-integrated design, the mask process is made more difficult. Thus, the process of manufacturing the flash memory cell serving as an important factor in implementing a uniform floating gate is made more difficult.

Due to the above reasons, if the floating gate is not uniformly formed, differences in the coupling ratio can be severe. Thus, upon program and erase of the memory cell, there is a possibility that an over erase problem may occur. This adversely affects the operational characteristics of the device. Also, the yield of the product is lowered and the cost is increased due to increased costs and lower yields of the mask process. In addition, failure of the device, or the like occurs due to a moat that is generated in STI and deep trench isolation (DTI) or nitride-spacer local oxidation of silicon (NS-LOCOS) process. In a highly-integrated flash device, it is important to increase the coupling ratio by securing a cell in which a moat does not occur.

SUMMARY OF THE DISCLOSURE

Methods are disclosed which prevent generation of a moat in a trench insulating film and to minimize spacing of a floating gate to be formed in a subsequent process, in such a way that a capping layer is formed on the trench insulating film and a cleaning process is then performed to etch the trench insulating film to a desired dimension.

Further, the disclosed method improves the coupling ratio between the floating gate and the control gate which will be formed in a subsequent process, by forming a capping layer on a trench insulating film in order to increase the height of the trench insulating film.

A disclosed method of forming a self-aligned floating gate in a flash memory cell comprises: forming a trench in a semiconductor substrate; forming a trench insulating film having a first protrusion at a portion of the trench, the first protrusion has a first width and a first height; forming a capping layer on the entire structure including the first protrusion; forming a second protrusion of the trench insulating film by etching the capping layer and a portion of the first protrusion, the second protrusion has a second width and a second height, the second width is narrower than the first width and the second height is lower than the first height; and forming a floating gate isolated by the second protrusion of the trench insulating film.

Also, a disclosed method of forming a self-aligned floating gate in a flash memory cell comprises: forming a pad oxide film and a pad nitride on a semiconductor substrate; forming a trench in the semiconductor substrate by etch a portion of the semiconductor substrate including the pad nitride film and the pad oxide film; forming a sacrifice oxide film on an internal surface of the trench; removing the sacrifice oxide film; forming a wall oxide film on the internal surface of the trench removed the sacrifice oxide film; forming a liner oxide film on the entire structure including the wall oxide film; forming a trench insulating film on the liner oxide film including the trench; forming a first protrusion of the trench insulating film at the trench by performing a chemical mechanical polishing process and removing the pad nitride film, the first protrusion has a first width and a first height; forming a capping layer on the entire structure including the first protrusion; forming a second protrusion of the trench insulating film by etching the capping layer and a portion of the first protrusion, the second protrusion has a second width and a second height, the second width is narrower than the first width and the second height is lower than the first height; forming a tunnel oxide film and a floating gate isolated by the second protrusion of the trench insulating film; removing the second protrusion of trench insulating film; and forming a dielectric film and a control gate.

BRIEF DESCRIPTION OF THE DRAWINGS

The aforementioned aspects and other features of the disclosed methods will be explained in the following description, taken in conjunction with the accompanying drawings, wherein.

DETAILED DESCRIPTION OF THE PRESENTLY PREFERRED EMBODIMENTS

The disclosed methods will be described in detail by way of a preferred embodiment with reference to accompanying drawings.

FIG. 1A to FIG. 1K are cross-sectional views of self-aligned floating gates in a flash memory cell for describing a method of the floating gate according to a preferred embodiment of the disclosed methods.

Figure 1A:
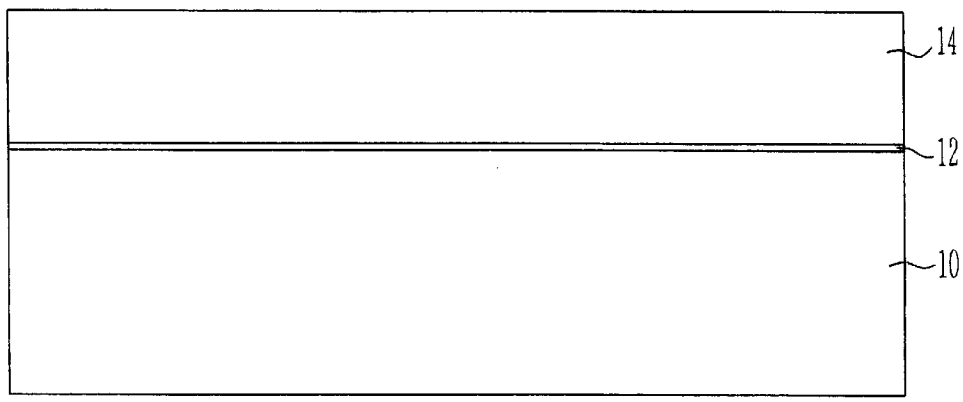
FIG. 1A to FIG. 1K are cross-sectional views of self-aligned floating gates in a flash memory cell for describing a method of manufacturing the floating gate according to one disclosed embodiment and variations thereof.

Referring now to FIG. 1A, a semiconductor substrate 10 is cleaned by a pre-processing cleaning process. Next, a pad oxide film 12 and a pad nitride film 14 are sequentially formed on the semiconductor substrate 10. At this time, the preprocessing cleaning process is performed using diluted HF (DHF, typically a HF solution into which $H_2O$ is diluted at the ratio of about 50:1) or buffer oxide etchant (BOE, which is a solution in which HF and $NH_4F$ are mixed at the ratio ranging from about 100:1 to about 300:1).

Further, the pad oxide film 12 is formed by dry or wet oxidization process at a given temperature in order to remove crystal defects or surface process on the surface of the semiconductor substrate 10. The pad nitride film 14 is formed to be at least about 3000 Å in thickness by means of a deposition process using a low pressure chemical vapor deposition (LP-CVD) method in order to increase the height of a trench insulating film to be formed in a subsequent process step.

Figure 1B:
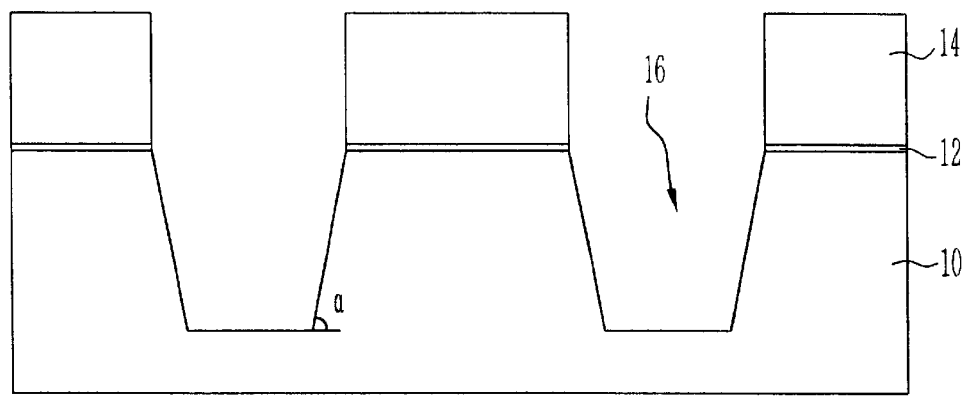

Referring now to FIG. 1B, a STI process using an isolation (ISO) mask is performed on the entire structure to etch a given portion of the semiconductor substrate 10 including the pad nitride film 14 and the pad oxide film 12. Therefore, a trench 16 through which a portion of the semiconductor substrate 10 is exposed is formed. Next, the semiconductor substrate 10 is divided into an active region and an inactive region (that is, a region in which the trench is formed) by the trench 16. At this time, the trench 16 has a given inclination angle 'α' and the pad nitride film 14 has an almost vertical profile.

Figure 1C:
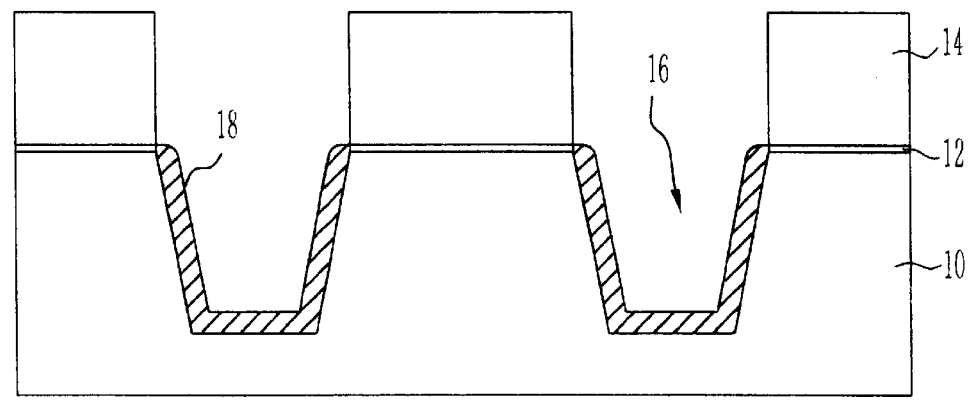

Referring now to FIG. 1C, a dry oxidization process of a wall sacrificial (SAC) oxidization process is performed to grow silicon located on an internal surface of the trench 16, thus forming a sacrificial oxide film 18 on an internal surface of the trench 16. Beforehand, in order to remove the native oxide film formed on the internal surface of the trench 16, a pre-processing cleaning process may be performed using DHF or BOE before the wall SAC oxidization process.

Figure 1D:
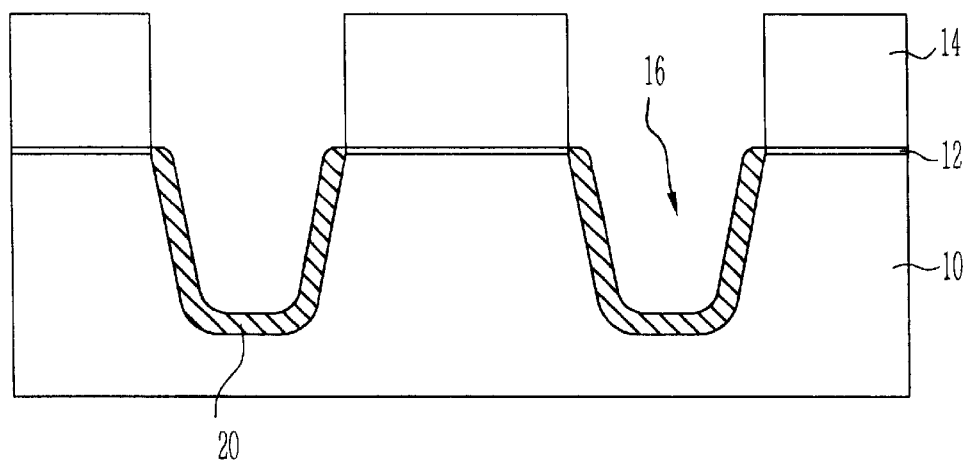

Referring now to FIG. 1D, the sacrificial oxide film 18 is removed by a cleaning process using an etch target having the same thickness of a deposition target of the sacrifice oxide film 18. Next, the wall oxidation process is performed to make rounded the bottom of the trench 16. Thus, a wall oxide film 20 is formed on an internal surface of the trench 16.

Figure 1E:
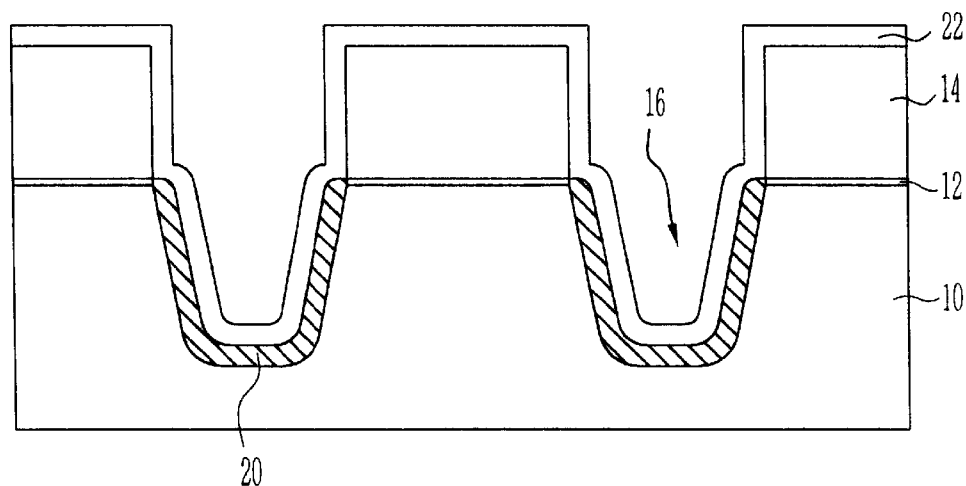

Referring now to FIG. 1E, a thin layer of high temperature oxide (HTO) 22 having DCS ($SiH_2Cl_2$) as a basic component is deposited on the entire structure. The HTO deposition process is performed at a high temperature, thus forming the liner oxide film 22. At this time, the HTO deposition process makes the texture of the liner oxide film 22 fine so that the etch resistance is increased. Therefore, in order to prevent formation of a moat generated during the STI process and to prevent a leakage current, the HTO deposition process is performed at a temperature of at least 1000° C.

Figure 1F:
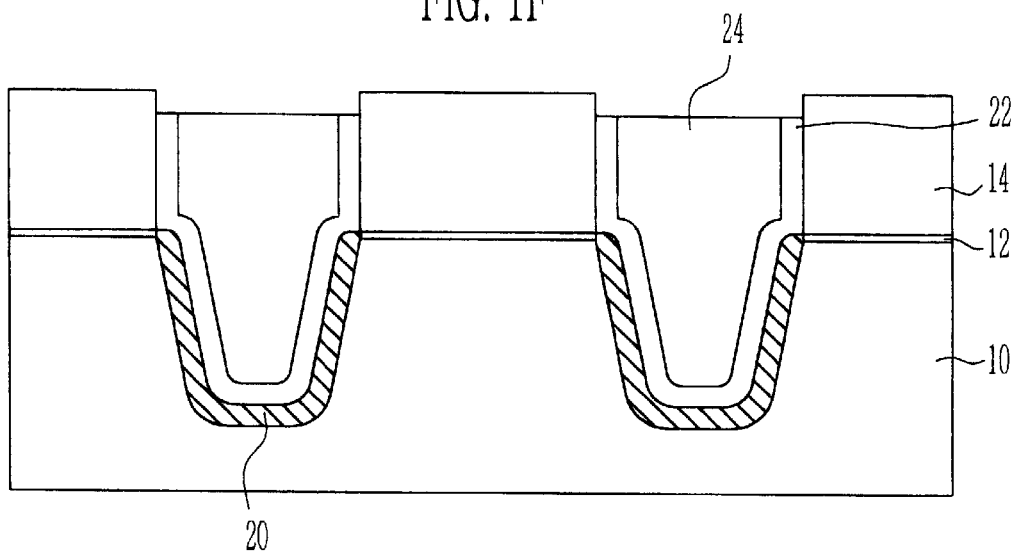

Referring now to FIG. 1F, a HDP oxide film for a trench insulating film is formed on the entire structure. Next, a chemical mechanical polishing (CMP) process is performed to form a trench insulating film 24 by which the trench 16 is buried. At this time, the HDP oxide film 24 for the trench insulating film is formed by a gap filling process so that void is not generated within the trench 16.

Further, the chemical mechanical polishing (CMP) process is performed using the pad nitride film 14 as an etch stopper until the pad nitride film 14 is exposed. Thereafter, in order to remove portions of the trench insulating film 24 that may remain on the pad nitride film 14, a cleaning process using HF or BOE is performed. Thus, the trench insulating film 24 is over etched so its top surface is below the pad nitride film 14, as shown.

Figure 1G:
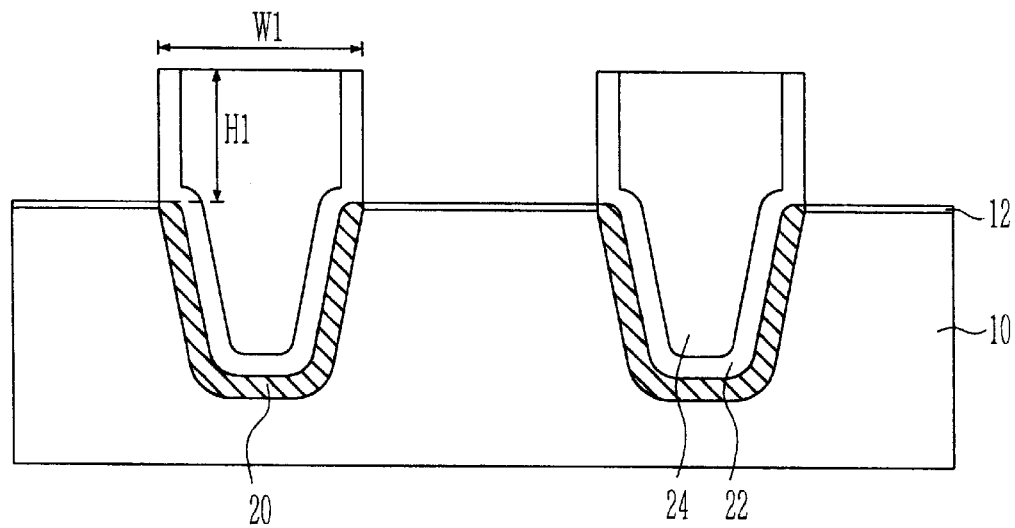

Referring now to FIG. 1G, a etching process using the pad oxide film 12 as an etch stopper is performed to etch the pad nitride film 14 except for the trench insulating film 24 until the pad oxide film 12 is exposed. As a result, a first protrusion is formed at an upper side of the trench insulating film 24. At this time, though the dimension of the trench insulating film 24 having the first protrusion may be different depending on the integration level of the device, a first height H1 of the trench insulating film 20 ranges from about 800 to about 2000 Å and a first width W1 of the trench insulating film 20 ranges from about 1800 to about 2100 Å, in a 0.18 μm technology.

Figure 1H:
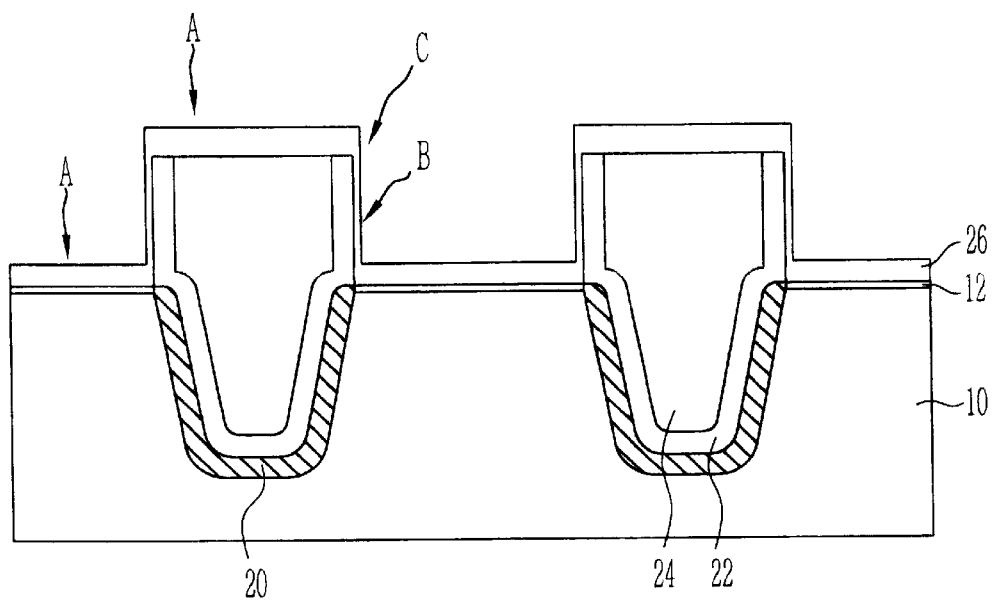

Referring now to FIG. 1H, a deposition process using the HDP oxide film is performed to form a capping layer 26 on the entire structure. The capping layer 26 is formed by the deposition process simultaneously occurring with deposition and etching of the capping layer. As a result, at this time, the capping layer 26 is so formed that the ratio of the deposition thickness between the thickness of a first portion A of the capping layer 26 and the thickness of a second portion B of the capping layer 26 ranges from about 3:1 to about 10:1. The first portion A is on the pad oxide film 12 and the first protrusion of the trench insulating film 24. The second portion B is on an outer sidewall of the first protrusion of the trench insulating film 24. The capping layer 26 is formed to be in thickness that ranges from about 300 to about 800 Å centering on the thickness of the first portion A.

The deposition process for forming the capping layer 26 is performed under the conditions that the temperature within the deposition equipment ranges from about 300 to about 450° C., the pressure ranges from about 2.5 to about 6.5 m Torr and silane ($SiH_4$), oxygen and argon gases are introduced into the deposition equipment at the flow rate that ranges from about 50 to about 200 sccm, from about 50 to about 300 sccm and from about 50 to about 300 sccm, respectively. Further, the deposition process includes applying a source plasma power ranging from about 2 to about 5 kW and simultaneously applying a bias power ranging from about 2 to about 5 kW toward the semiconductor substrate 10 or applying a low power of almost 0 W. Thus, etching of a third portion C due to argon gas can be minimized.

It is preferred that the capping layer 26 is formed to be almost vertical in order to minimize etching of the third portion C. If the third portion C is over etched during the process of depositing the capping layer 26, problems can occur in a subsequent CMP process of the first polysilicon layer. Further, a given portion of the trench insulating film 24 is etched due to an AC bias power. Thus, the phenomenon that an etched portion is re-deposited on the active region occurs. Therefore, it is preferred that the AC bias power is minimized or the AC bias power is not applied during the process of depositing the capping layer 26.

As such, the reason why the first portion A of the capping layer 26 is formed several times thicker than the second portion B is to minimize reduction in the first height H1 of the first protrusion of the trench insulating film 24 compared to reduction in the first width W1 of those during a subsequent etching process for etching the trench insulating film 24. As such, the etch rate in a portion where a moat is generated (i.e., a boundary between the pad oxide film and the trench insulating film) and the upper portion of the protrusion of the trench insulating film 24 is minimized. Thus, generation of a moat can be prevented by maximum and the height of an upper side of the protrusion of the trench insulating film 24 can be simultaneously maintained higher by maximum. Due to this, the contact area between the floating gate and the control gate, which will be formed in a subsequent process, is widened to improve the coupling ratio. Further, as the etching rate of the sidewall of the protrusion of the trench insulating film 24 is increased by maximum, spacing of the floating gate to be formed in a subsequent process can be improved.

Figure 1I:
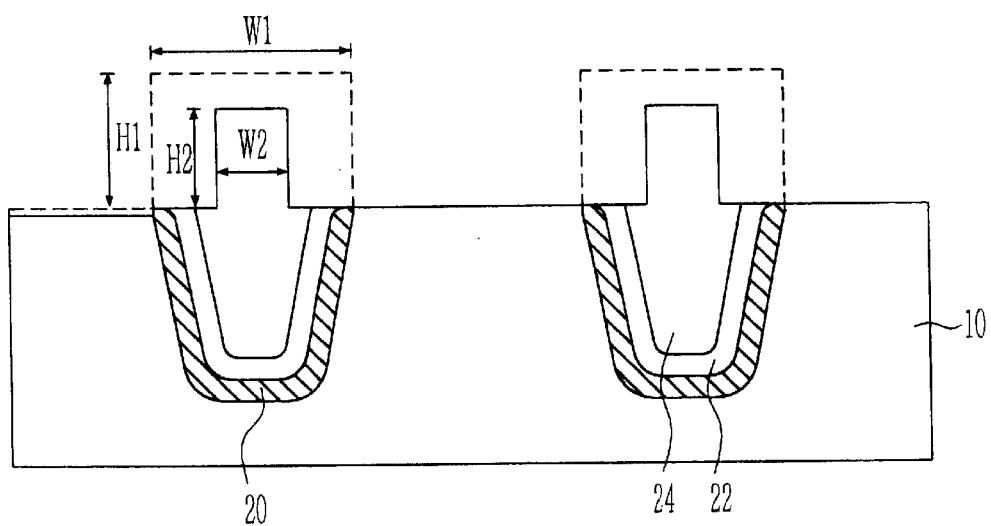

Referring now to FIG. 1I, an etching process is performed using BOE or HF and setting an etch target to a deposition thickness of the capping layer 26 in order to completely remove the pad oxide film 12 and the capping layer 26. The first protrusion of the trench insulating film 24 is etched to a given thickness while the pad oxide film 12 and the capping layer 26 are removed. The trench insulating film 24 having a nipple shape is thus formed. At this time, a second height H2 and a second width W2 of the second protrusion of the nipple shape ranges from about 500 to about 1800 Å and from about 500 to about 1200 Å, respectively.

As noted above, the first protrusion of trench insulating film 24 can be etched to a desired dimension by performing the etching process setting the etch target to the thickness of the capping layer 26. Therefore, generation of a moat in the trench insulating film 24 can be prevented and the spacing between the floating gates formed in a subsequent process can be minimized.

Next, a given wet or dry oxidization process is performed for a portion of the structure from which the pad oxide film 12 is removed, thus forming a screen oxide film (not shown). A well ion implantation process and a threshold voltage ion implantation process are performed for the entire structure to form a well region (not shown) and an impurity region (not shown) in the active region of the semiconductor substrate 10.

Figure 1J:
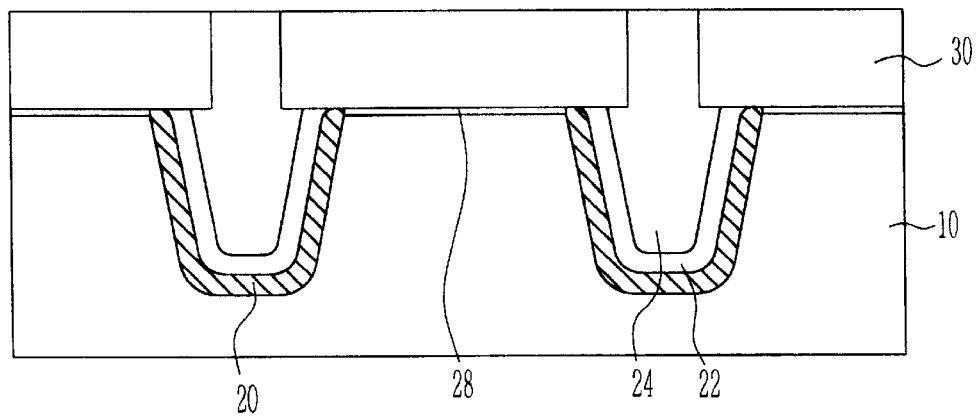

Referring now to FIG. 1J, the screen oxide film is removed. A given deposition process is performed to form a tunnel oxide film 28 having a thickness ranging from about 50 to about 100 Å. Next, a first polysilicon layer for a floating gate is deposited on the entire structure. A chemical mechanical polishing (CMP) is then performed using the trench insulating film 24 as an etch stopper in order to polish a given portion of the first polysilicon layer. A floating gate 30 isolated by the trench insulating film 24 is thus formed.

Figure 1K:
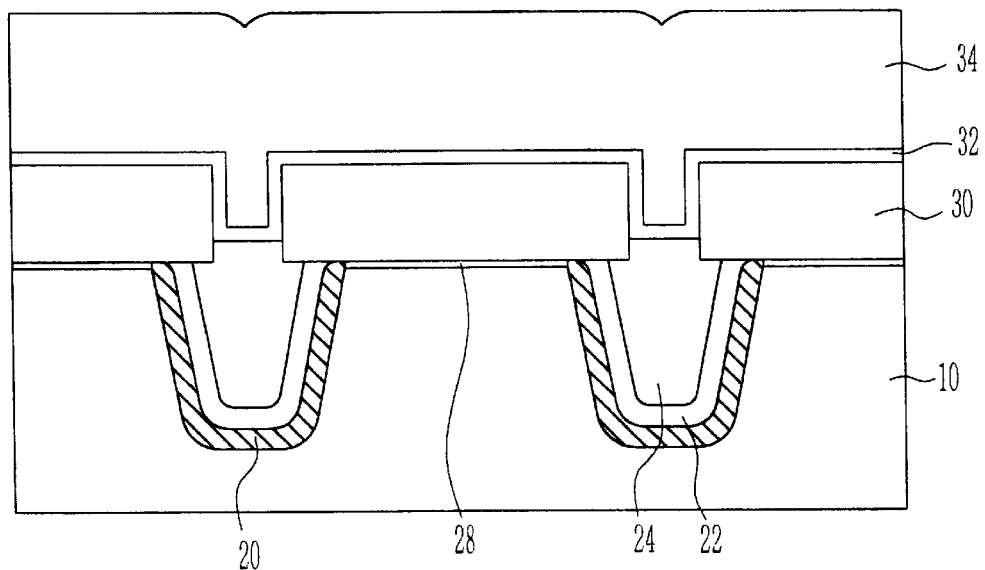

Referring now to FIG. 1K, an etching process using HF or BOE is performed to remove the second protrusion of trench insulating film 24 situated between the floating gates 30 with an etch target ranging from about 500 to about 2000 Å.

Next, a dielectric film 32 of an oxide/nitride/oxide (ONO) structure or an oxide/nitride/oxide/nitride (ONON) structure and a second polysilicon layer 34 for a control gate are sequentially deposited on the entire structure. The dielectric film 32 and the second polysilicon layer 34 are then patterned by a given etching process, thus forming the control gate (not shown).

As mentioned above, according to the disclosed methods, a capping layer is formed on a trench insulating film and an etching process is then performed to etch the trench insulating film to a desired dimension. Therefore, the disclosed method can prevent generation of a moat in the trench insulating film and minimize spacing of a floating gate formed in a subsequent process.

Further, according to the disclosed method, as the width of the floating gate can be increased by minimizing spacing of the floating gate, program and erase characteristics can be improved. Further, the coupling ratio can be minimized since variation in the floating gate is reduced.

In addition, according to the disclosed methods, as the thickness of the trench insulating film can be increased so much as the capping layer, the CMP margin can be secured during a CMP process for forming the floating gate.

The disclosed methods have been described with reference to a particular embodiment in connection with a particular application. Those having ordinary skill in the art and access to the teachings of this disclosure will recognize additional modifications and applications within the scope thereof.

It is therefore intended by the appended claims to cover any and all such applications, modifications, and embodiments within the scope and spirit of this disclosure.

What is claimed is:

1. A method of forming a self-aligned floating gate in a flash memory cell, the method comprising:

forming a trench in a semiconductor substrate;

forming a trench insulating film comprising a first protrusion in the trench, the first protrusion has a first width and a first height;

forming a capping layer on the entire structure;

forming a second smaller protrusion in the trench insulating film by etching the capping layer and a portion of the first protrusion, the second protrusion has a second width and a second height, the second width being narrower than the first width and the second height is less than the first height; and forming a floating gate isolated by the second protrusion of the trench insulating film.

2. The method as claimed in claim 1, wherein thicknesses of all portions of the capping layer except portions formed on both sidewalls of the first protrusion of the trench insulating film are thicker by a range from about 3 to about 10 times than thicknesses of the capping layer formed on both sidewalls of the first protrusion of the trench insulating film.

3. The method as claimed in claim 1, wherein a portion of the capping layer, that is formed corresponding to an edge portion of the first protrusion, is substantially vertical.

4. The method as claimed in claim 1, wherein the capping layer is formed by a plasma deposition process simultaneously occurring during deposition and etching of the capping layer.

5. The method as claimed in claim 4, wherein the plasma deposition process is performed with a temperature ranging from about 300 to about 450° C. and a pressure ranging from about 2.5 to about 6.5 m Torr, after silane, oxygen and argon gases are introduced at the flow rates ranging from about 50 to about 200 sccm, from about 50 to about 300 sccm and from about 50 to about 300 sccm, respectively.

6. The method as claimed in claim 4, wherein the plasma process includes applying a bias power ranging from about 0 to about 5 kW.

7. The method as claimed in claim 1, wherein a thickness of the capping layer ranges from about 300 to about 800 Å.

8. The method as claimed in claim 1, wherein the capping layer comprises a HDP oxide film.

9. The method as claimed in claim 1, wherein the etching of the capping layer and the first protrusion to form the second protrusion is performed using BOE or HF and setting an etch target having a maximum thickness of the capping layer.

10. The method as claimed in claim 1, further comprising:

after the trench is formed, forming a sacrificial oxide film on an internal surface of the trench;

removing the sacrificial oxide film;

forming a wall oxide film on the internal surface of the trench removed the sacrifice oxide film; and forming a liner oxide film on the wall oxide film.

11. A method of forming a self-aligned floating gate in a flash memory cell, the method comprising:

forming a pad oxide film and a pad nitride on a semiconductor substrate;

forming a trench in the semiconductor substrate by etching a portion of the semiconductor substrate, the pad nitride film and the pad oxide film;

forming a sacrificial oxide film on an internal surface of the trench;

removing the sacrificial oxide film;

forming a wall oxide film on the internal surface of the trench;

forming a liner oxide film on the entire structure;

forming a trench insulating film on the liner oxide film;

forming a first protrusion of the trench insulating film by performing a chemical mechanical polishing process and removing the pad nitride film, the first protrusion having a first width and a first height;

forming a capping layer on the entire structure;

forming a second protrusion of the trench insulating film by etching the capping layer and a portion of the first protrusion, the second protrusion having a second width and a second height, the second width being narrower than the first width and the second height being less than the first height;

forming a tunnel oxide film and a floating gate isolated by the second protrusion of the trench insulating film;

removing the second protrusion of trench insulating film; and forming a dielectric film and a control gate.

12. The method as claimed in claim 11, wherein thicknesses of all portions of the capping layer except portions formed on both sidewalls of the first protrusion of the trench insulating film are greater by a range from about 3 to about 10 times than thicknesses of the capping layer formed on both sidewalls of the first protrusion of the trench insulating film.

13. The method as claimed in claim 11, wherein the capping layer is formed by a plasma deposition process simultaneously occurring during deposition and etching of the capping layer.

14. The method as claimed in claim 13, wherein the plasma deposition process is performed with a temperature ranging from about 300 to about 450° C. and a pressure ranging from about 2.5 to about 6.5 m Torr, after silane, oxygen and argon gases are introduced at flow rates ranging from about 50 to about 200 sccm, from about 50 to about 300 sccm and from about 50 to about 300 sccm, respectively.

15. The method as claimed in claim 13, wherein the plasma process comprises applying a bias power ranging from about 0 to about 5 kW.

16. The method as claimed in claim 11, wherein a maximum thickness of portions of the capping layer not disposed on sidewalls of the first protrusion ranges from about 300 to about 800 Å.

17. The method as claimed in claim 11, wherein the capping layer comprises a HDP oxide film.

18. The method as claimed in claim 11, wherein the etching process to form the second protrusion is performed using BOE or HF and setting an etch target having the same thickness as portions of the capping layer not disposed on the sidewalls of the first protrusion.

* * * * *